United States Patent [19]
Liao et al.

[11] Patent Number: 5,469,476
[45] Date of Patent: Nov. 21, 1995

[54] CIRCUIT AND METHOD FOR FILTERING VOLTAGE SPIKES

[75] Inventors: Benson Liao; Taming Wang, both of Taipei, Taiwan

[73] Assignee: Motorola, Inc., Schaumburg, Ill.

[21] Appl. No.: 210,850

[22] Filed: Mar. 21, 1994

[51] Int. Cl.$^6$ .................................................. H04B 1/10
[52] U.S. Cl. ........................... 375/350; 375/238; 375/346
[58] Field of Search ............................ 375/99, 103, 238; 328/167; 307/234; 327/556, 31; 341/53

[56] References Cited

U.S. PATENT DOCUMENTS

| | | | |
|---|---|---|---|
| 3,644,677 | 2/1972 | Cecchin et al. | 375/22 |
| 5,343,496 | 8/1994 | Honig et al. | 375/103 |

Primary Examiner—Stephen Chin
Assistant Examiner—T. Ghebretinsae
Attorney, Agent, or Firm—Gary W. Hoshizaki

[57] ABSTRACT

A spike filter circuit (11) has an input (12) for receiving an input signal comprising data bits and an output (13) for providing a filtered output signal. A data bit is characterized by a voltage magnitude and a minimum time period. The spike filter circuit (11) filters out any signal applied to the input (12) that has a period less than the minimum time period of a data bit. The spike filter circuit comprises a pulse width sense circuit (14), a Schmitt trigger (16), and a delay circuit (17). The pulse width sense circuit (14) is responsive to the input signal and filters out signals having a period less than the minimum time period of a data bit. The Schmitt trigger (16) is responsive the pulse width sense circuit (14), has predetermined threshold voltages to increase noise immunity, and buffers the output of the pulse width sense circuit (14). The delay circuit (17) is responsive to the filtered output signal and provides a signal delayed by a predetermined time to a feedback input of the pulse width sense circuit (14). The signal provided by the delay circuit (17) inhibits the pulse width sense circuit (14) from sensing a data bit (having an opposite logic level to that at the output (13)) for the delay of the predetermined time of the delay circuit (17).

19 Claims, 4 Drawing Sheets

5,469,476

CIRCUIT AND METHOD FOR FILTERING VOLTAGE SPIKES

BACKGROUND OF THE INVENTION

This invention relates, in general, to filter circuits, and more particularly, to spike filter circuits for receiving asynchronous data.

Digital data is typically transferred between a transmitter circuit and one or more receiver circuits. Synchronous data transmission requires a transmitter and a receiver circuit to be synchronized to one another to insure error free transmission. For some systems it may be difficult to synchronize transmitter and receiver circuits depending on the mode of transmission and the location of the receiver circuits.

Asynchronous data transmission simplifies the transmission of data but requires a receiver circuit capable of detecting when data is transmitted. Furthermore, the rejection of noise is critical to the integrity of transmitted data, noise must not be interpreted by a receiver circuit as data. Many error prevention techniques such as error correction codes or data protocols are implemented to minimize errors in asynchronous data transmission.

One common problem in the transmission of data is noise. Receiver circuits are designed to be sensitive to voltage changes that represent data. Thus receiver circuits are also sensitive to voltage changes produced by noise. For example, a noise spike is sometimes introduced to a stream of data due to capacitive coupling from one transmission line to another wherein a receiver circuit could interpret the noise spike as a data bit corrupting the entire stream of data. Noise spikes are also generated by common elements in the data environment such as a power surge or an electromagnetic pulse.

It would be of great benefit if a circuit could be developed that detects and filters out noise before being processed by a receiver circuit thereby reducing an error mechanism common to data transmission.

DETAILED DESCRIPTION OF THE DRAWINGS

Receiver circuits for sensing and translating bit streams of digital data are designed to be extremely sensitive to voltage changes. Noise introduced to the transmission medium, for example a noise spike, can appear to a receiver circuit as a data bit thereby producing an unwanted and incorrect signal by the receiver circuit.

In general, a data bit has predefined attributes that determine its validity and logic level. The voltage magnitude of a data bit determines its logic level. For example, a five volt digital system typically has a logic one level of approximately 5 volts and a logic zero level of approximately 0 volts. The large voltage difference between logic levels increases its immunity to false detection due to noise. Still, it is possible to generate noise spikes that have a voltage magnitude sufficient to cause false detection.

Another attribute is a minimum pulse width of a data bit. In order for a data bit to be valid, the logic level must be presented for the minimum pulse width. The minimum pulse width is typically chosen by the maximum data transmission rate. For example, a data bit having a minimum pulse width of 5 nanoseconds would correspond to a maximum data transmission rate of 200 million bits per second.

Figure 1:
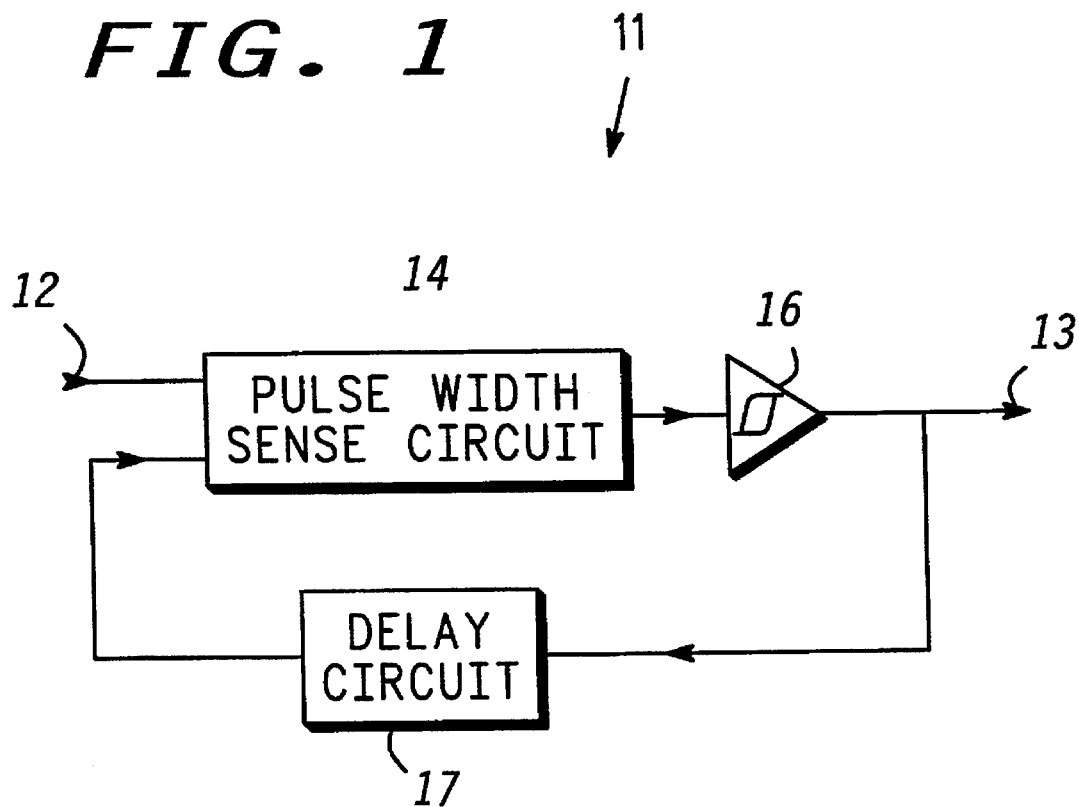
FIG. 1 is a block diagram of a spike filter in accordance with the present invention.

Pre-processing data to eliminate noise before reaching a receiver circuit is one method for reducing data sensing errors. A filtering criteria to eliminate noise is the minimum pulse width for a data bit. FIG. 1 is a block diagram of a spike filter circuit 11 that filters all signals having a pulse width less than a minimum pulse width of a data bit. Spike filter circuit 11 also modifies a pulse width of a valid data bit signal applied to its input by providing an output signal having a minimum output pulse width.

Spike filter circuit 11 has an input 12 for receiving an input data stream and an output 13 for providing a filtered data bit stream. A data stream comprises a plurality of data bits each having a logic level. In the preferred embodiment, spike filter circuit 11 is coupled for receiving first and second power supply voltages (not shown). A logic one level corresponds to a voltage magnitude of approximately the first power supply voltage and a logic zero level corresponds to a voltage magnitude of approximately the second power supply voltage as is well known. For example, spike filter circuit 11 receiving power supply voltages of five volts and ground would have a logic one level of five volts and a logic zero level of zero volts. Spike filter circuit 11 comprises a pulse width sense circuit 14, a Schmitt trigger 16, and a delay circuit 17. Pulse width sense circuit 14 includes an input coupled to input 12, a feedback input, and an output. Schmitt trigger 16 has an input coupled to the output of pulse width sense circuit 14 and an output coupled to output 13. Delay circuit 17 has an input coupled to output 13 and an output coupled to the feedback input of pulse width sense circuit 14.

In the preferred embodiment, pulse width sense circuit 14 is responsive to an input digital signal applied to input 12. Pulse width sense circuit 14 provides an output signal corresponding to a logic level of the input digital signal when the pulse width of the input digital signal exceeds the minimum pulse width of a data bit.

A Schmitt trigger is well known by one skilled in the art for having predetermined threshold voltages at which it triggers for a positive voltage transition and a negative voltage transition. Hysterisis is used within a Schmitt trigger to generate different threshold voltages for positive and negative input voltage transitions. Schmitt trigger 16 is responsive to an output signal of pulse width sense circuit 14. Schmitt trigger 16 buffers pulse width sense circuit 14, increases noise immunity of spike filter circuit 11, and provides high speed transitions between logic levels at output 13.

For example, output 13 is at a logic zero level and a valid logic one level data bit applied to input 12 causes pulse width sense circuit 14 to output a voltage greater than a positive threshold voltage of Schmitt trigger 16. Schmitt trigger 16 outputs a logic one level when the positive threshold voltage is exceeded. Conversely, a noise signal at input 12 having a logic one level less than the minimum pulse width of a data bit causes pulse width sense circuit 14 to produce a voltage less than the positive threshold voltage of Schmitt trigger 16. In this case, Schmitt trigger 16 does not respond and its output remains at the logic zero level.

Delay circuit 17 is responsive to a logic level at output 13 for providing a delayed output signal to the feedback input of pulse width sense circuit 14. In the preferred embodiment, delay circuit 17 inhibits pulse width sense circuit 14 from responding to a first logic level for a predetermined time after an output signal at output 13 transitions from the first logic level to a second logic level. The predeteremined time corresponds to the delay of delay circuit 17.

Figure 2:
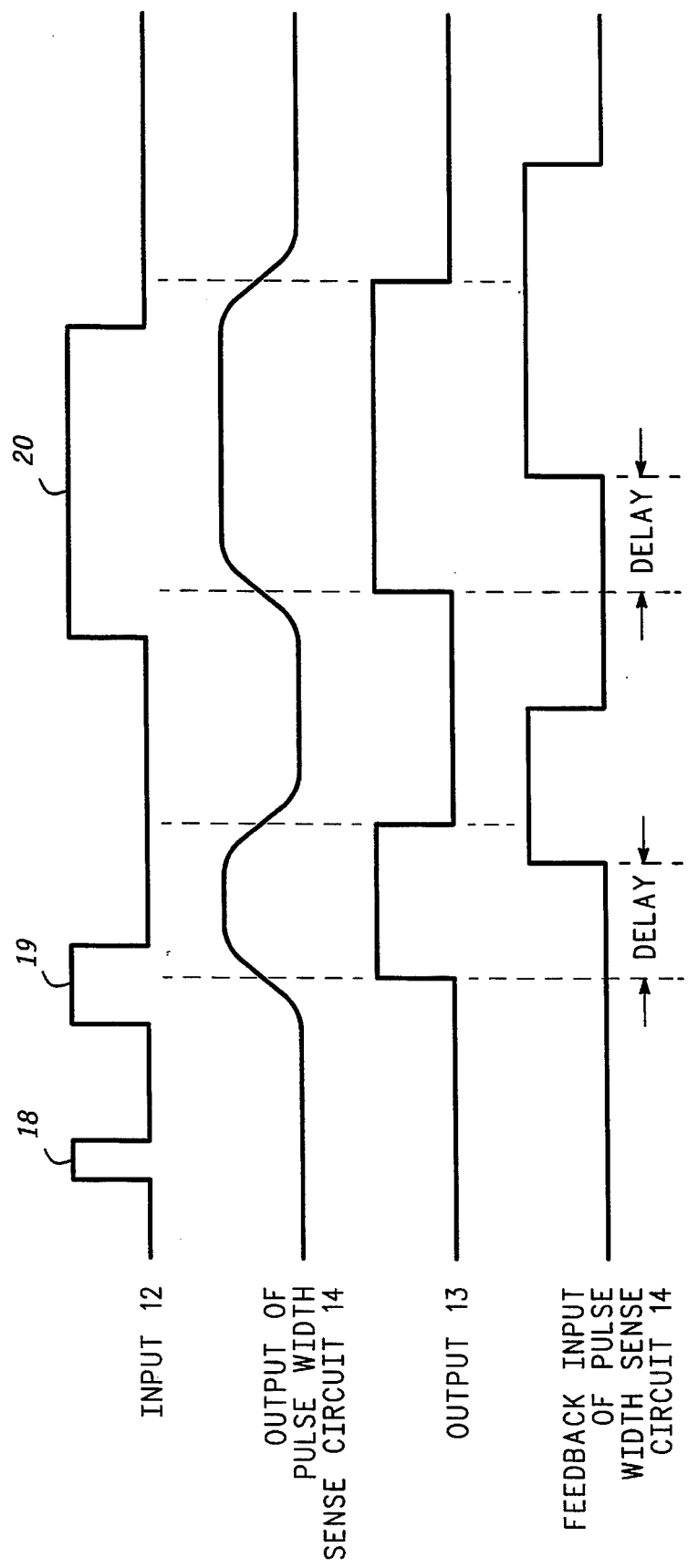
FIG. 2 is a timing diagram corresponding to the spike filter of FIG. 1.

FIG. 2 is a timing diagram illustrating the operation of spike filter circuit 11 of FIG. 1. Prior to a voltage pulse 18 both input 12 and output 13 of spike filter circuit 11 (FIG. 1) are at logic zero levels. Voltage pulse 18 applied to input 12 of spike filter circuit 11 has a pulse width less than the minimum pulse width of a data bit. The output of pulse width sense circuit 14 (FIG. 1) remains at a zero logic level. Voltage pulse 18 is filtered out by spike filter circuit 11 and output 13 remains at the logic zero level.

A voltage pulse 19 applied to input 12 has a pulse width equal to the minimum pulse width of a data bit. Both input 12 and output 13 are at logic zero levels prior to voltage pulse 19. The output of pulse width sense circuit 14 transitions from a logic zero level to a logic one level that is greater than a positive threshold voltage of Schmitt trigger 16 (FIG. 1). Output 13 transitions from a logic zero level to a logic one level when the input of Schmitt trigger 16 exceeds the positive threshold voltage. Pulse width sense circuit 14 is inhibited by the logic zero level at output 13 from receiving a logic zero level at input 12 until the delayed signal arrives. Once the delayed signal arrives at the feedback input of pulse width sense circuit 14 it is enabled for receiving the logic zero level at input 12 and transitions from the logic one level to a logic zero level. A logic zero level is generated at output 13 when the input of Schmitt trigger 16 is less than its negative threshold voltage. Delay circuit 17 (FIG. 1) affects the pulse width of the voltage pulse at output 13, in this example, by increasing the pulse width greater than the pulse width of voltage pulse 19.

A voltage pulse 20 applied to input 12 has a pulse width greater than the minimum pulse width of a data bit. Both input 12 and output 13 are at logic zero levels prior to voltage pulse 20. The output of pulse width sense circuit 14 (FIG. 1) transitions from the logic zero level to a logic one level in response to voltage pulse 20. Schmitt trigger 16 is responsive to pulse width sense circuit 14 and transitions from the logic zero level to a logic one level at its output. Input 12 is at a logic one level when the delayed signal (logic one level) provided by delay circuit 17 arrives at the feedback input of pulse width sense circuit 14 thus spike filter circuit 11 remains at a logic one level (output 13). In this example, delay circuit 17 does not affect the pulse width of the voltage pulse at output 13. Output 13 transitions from the logic one level to a logic zero level after voltage pulse 20 transitions from the logic one level to a logic zero level. Hence, spike filter circuit 11 filters out voltage pulses having a pulse width less than the minimum pulse width of a data bit. Also, upon receiving a valid data bit, spike filter circuit 11 provides an output voltage pulse corresponding to the logic level of the valid data bit having a minimum output pulse width. It should be noted that spike filter circuit 11 responds in analogous fashion to logic zero level voltage pulses similar to the logic one level voltage pulses described above.

Figure 3:
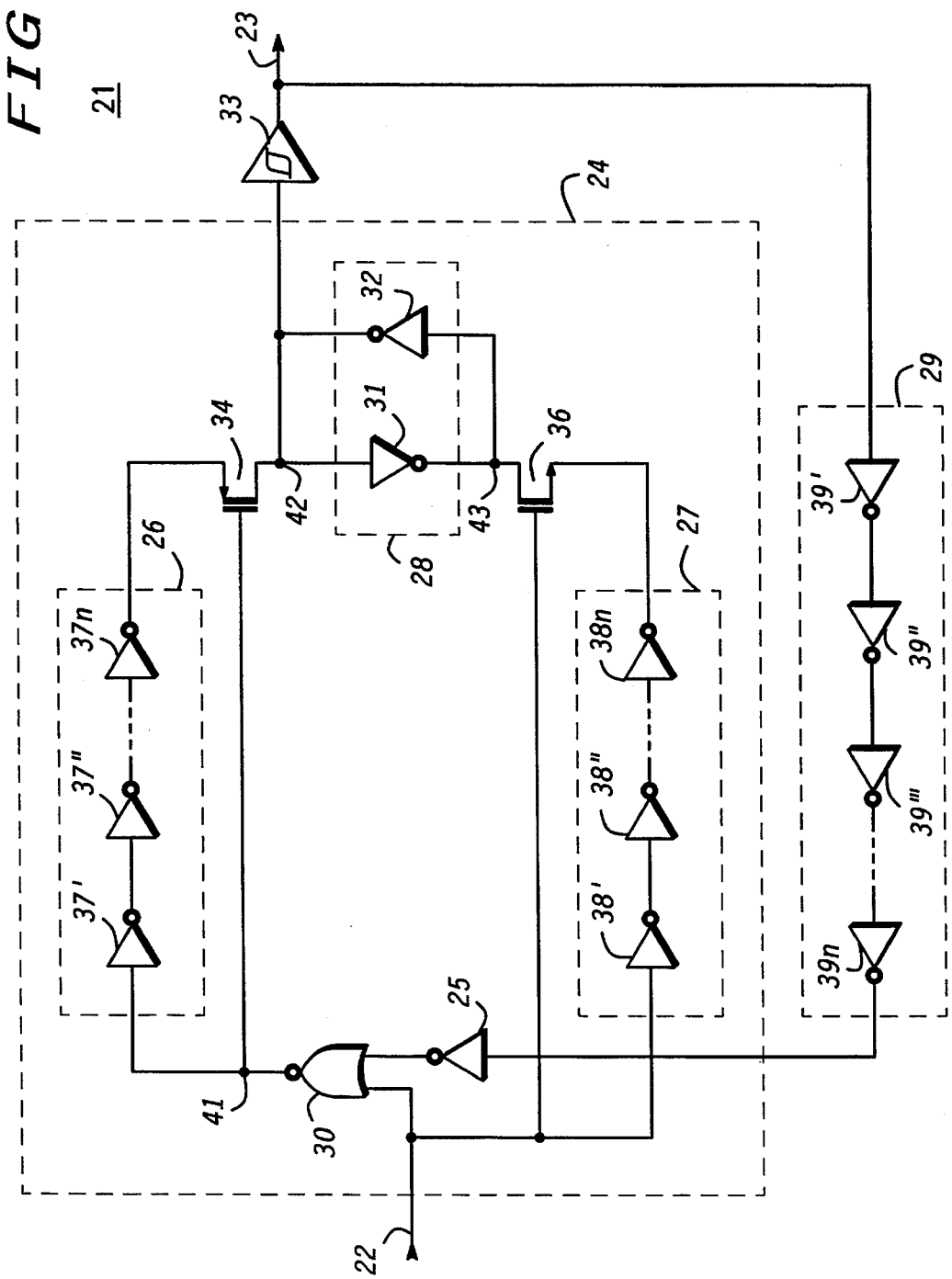
FIG. 3 is a schematic diagram of a spike filter in accordance with the present invention.

FIG. 3 is a schematic diagram of a spike filter circuit 21 including an input 22 and an output 23. Spike filter circuit 21 comprises a pulse width sense circuit 24 corresponding to pulse width sense circuit 14 of FIG. 1, a Schmitt trigger 33 corresponding to Schmitt trigger 16 of FIG. 1, and a delay circuit 29 corresponding to delay circuit 17 of FIG. 1. Pulse width sense circuit 24 has an input coupled to input 22 of spike filter circuit 21, a feedback input, and an output. Schmitt trigger 33 has an input coupled to the output of pulse width sense circuit 24 and an output coupled to output 23 of spike filter circuit 21. In the preferred embodiment, Schmitt trigger 33 is non-inverting. Delay circuit 29 has an input coupled to output 23 of spike filter circuit 21 and an output coupled to the feedback input of pulse width sense circuit 24.

Pulse width sense circuit 24 comprises a NOR gate 30, inverter 25, delay line 26, delay line 27, latch 28, and n-channel enhancement MOSFETs 34 and 36. Inverter 25 has an input coupled to the feedback input of pulse width sense circuit 24 and an output. NOR gate 30 has a first input coupled to the input of pulse width sense circuit 24, a second input coupled to the output of inverter 25, and an output coupled to a node 41. Delay line 26 has an input coupled to node 41 and an output. N-channel enhancement MOSFETs 34 and 36 each have a drain, gate, and source corresponding to a first electrode, a control electrode, and a second electrode. N-channel enhancement MOSFET 34 has the drain coupled to a node 42, the gate coupled to node 41, and the source coupled to the output of delay line 26. Node 42 corresponds to the output of pulse width sense circuit 24. Latch 28 has a first terminal coupled to node 42 and a second terminal coupled to a node 43. Delay line 27 has an input coupled to the input of pulse width sense circuit 24 and an output. N-channel enhancement MOSFET 36 has the drain coupled to node 43, the gate coupled to the input of pulse width sense circuit 24, and the source coupled to the output of delay line 27.

In the preferred embodiment, delay lines 26 and 27 comprise a string of inverters 37 and 38 respectively. String of inverters 37 and 38 are a plurality of inverters coupled in series. An odd number of inverters are used in the string of inverters for delay lines 26 and 27 to produce an inverted signal. Other types of logic elements or delay elements could be used in place of inverters 26 and 27 as is well known by one skilled in the art. Delay lines 26 and 27 invert and delay a signal applied to its input for a first predetermined time delay.

In the preferred embodiment, latch 28 is an inverter latch comprising an inverter 31 and an inverter 32. Inverter 31 has an input coupled to the first terminal of latch 28 and an output coupled to the second terminal of latch 28. Inverter 32 has an input coupled to the second terminal of latch 28 and an output coupled to the first terminal of latch 28. Latch 28 is driven to a different logic level via the first or second terminals. A predetermined threshold voltage must be exceeded for data to latch into latch 28 as is well known by one skilled in the art. The threshold voltage for latch 28 is determined by inverters 31 and 32. In the preferred embodiment, a voltage at the first and second terminals of latch 28 required to latch in a logic zero level is chosen to be less than the positive threshold voltage of Schmitt trigger 33 to insure that a metastable condition for latch 28 does not falsely trigger Schmitt trigger 33.

In the preferred embodiment, delay circuit 29 comprises an inverter string 39. Inverter string 39 comprises an even number of inverter elements. Delay circuit 29 provides a non-inverting signal and delays a signal applied to its input for a second predetermined time delay.

Operation of spike filter circuit 21 is described hereinafter. Spike filter circuit 21 filters an input signal having digital information and provides a filtered output signal. An input signal comprises a plurality of logic one and logic zero levels representing data bits. Each data bit is characterized by a voltage magnitude corresponding to a logic one level or logic zero level and each data bit must be greater than or equal to a minimum pulse width to be valid. Spike filter circuit 21 filters or removes signals having a pulse width less than the minimum pulse width of a data bit.

A first mode of operation of spike filter circuit 21 occurs when input 22 and output 23 are at a zero logic level. Table 1 describes the initial logic levels of spike filter circuit 21 under the first mode of operation.

TABLE 1

| input 22 | node 41 | node 42 | node 43 | output 23 |
|---|---|---|---|---|
| 0 | 0 | 0 | 1 | 0 |

Latch 28 holds nodes 42 and 43 at logic zero and logic one levels respectively. Inverter 25 inverts the logic zero level at output 23 and provides a logic one level to the second input of NOR gate 30. NOR gate 30 holds node 41 at the logic zero level by feeding back the logic zero level at output 23. The logic zero level at node 41 provided by NOR gate 30 disables n-channel enhancement MOSFET 34. In the first mode of operation, spike filter circuit 21 is armed for receiving a logic one level and output 23 remains at the logic zero level until input 22 receives a valid logic one level.

A second mode of operation of spike filter circuit 21 occurs when it is armed for receiving a logic one level (as described above) but receives a voltage pulse having a pulse width less than the minimum pulse width of a data bit. Pulse width sense circuit 24 filters the voltage pulse and produces a voltage at its output that is less than a positive threshold voltage of Schmitt trigger 33.

A logic one level at input 22 enables n-channel enhancement MOSFET 36. Delay line 27 inverts and delays the input signal at input 22 for the first predetermined time delay. The first predetermined time delay of delay line 27 inhibits latch 28 from being set if the voltage pulse has a pulse width less than the minimum pulse width of a data bit. Node 43 begins to transition from the logic one level to a logic zero level when the gate of n-channel enhancement MOSFET 36 is at a logic one level and its source is at a logic zero level. If the voltage pulse has a pulse width of a short duration, the gate of n-channel enhancement MOSFET 36 will be at a logic zero level by the time delay line 27 provides a logic zero level to its source thus n-channel enhancement MOSFET 36 is never enabled for changing the logic level at node 43.

N-channel enhancement MOSFET 36 causes node 43 to transition from the logic one level towards a logic zero level if the voltage pulse has a pulse width greater than the first predetermined time delay but less than the minimum pulse width of a data bit. The voltage at node 43 transitions towards a logic zero level but is stopped short when the logic one level at input 22 transitions to a logic zero level thereby disabling n-channel enhancement MOSFET 36. The voltage at node 43 does not exceed the predetermined threshold voltage of latch 28 required to latch a logic zero level at node 43 and a logic one level at node 42. Latch 28 returns to its previous state with nodes 42 and 43 being at logic zero and logic one levels respectively. It should be noted that the voltages at nodes 42 and 43 transition when receiving a noise spike as described above but the voltage transition does not exceed the threshold voltage of Schmitt trigger 33.

A third mode of operation of spike filter circuit 21 occurs when it is armed for receiving a logic one level (as described above) but receives a voltage pulse having a pulse width greater than or equal to the minimum pulse width of a data bit. Pulse width sense circuit 24 is responsive to the voltage pulse and produces a voltage at its output that is greater than a positive threshold voltage of Schmitt trigger 33. The initial voltages of spike filter circuit 21 for the third mode of operation is shown in Table 2.

TABLE 2

| input 22 | node 41 | node 42 | node 43 | output 23 |
|---|---|---|---|---|
| 0–1 | 0 | 0 | 1 | 0 |

Since the voltage pulse has a pulse width greater than the first predetermined time delay of delay line 27, n-channel enhancement MOSFET 36 is enabled. The gate and source of n-channel enhancement MOSFET 36 receives a logic one level and a logic zero level respectively after the first predetermined time delay. If the voltage pulse has a pulse width equal to the minimum pulse width of a data bit, n-channel enhancement MOSFET is enabled for a time sufficient to pull node 43 past the predetermined threshold voltage of latch 28. Latch 28 changes logic levels holding node 43 at a logic zero level and node 42 at a logic one level. Schmitt trigger generates a logic one level at output 23 when its positive threshold voltage is exceeded at node 42. The change in logic levels of spike filter circuit 1 is shown in Table 3.

TABLE 3

| input 22 | node 41 | node 42 | node 43 | output 23 |
|---|---|---|---|---|
| 1 | 0 | 1 | 0 | 0–1 |

Delay circuit 29 determines a minimum output pulse width of a voltage pulse provided by spike filter circuit 21 at output 23. Delay line 29 inhibits pulse width sense circuit 24 from sensing a logic zero level applied to input 22 for the second predetermined time delay after output 23 transitions from the logic zero level to a logic one level. A voltage pulse applied to input 22 will return to a logic zero level before the output of inverter 25 transitions from the logic one level to a logic zero level if its pulse width is less than the second predetermined time delay. The logic one level at the output of inverter 25 inhibits NOR gate 30 from sensing the logic zero level at input 22. In this state, the output of NOR gate 30 is at a logic zero level which disables n-channel enhancement MOSFET 34. After the second predetermined time delay the output of inverter 25 transitions from the logic one level to a logic zero level. Spike filter circuit 21 is armed for receiving a logic zero level at input 22.

A fourth mode of operation occurs when output 23 of spike filter circuit 21 transitions from a logic zero level to a logic one level. Latch 28 holds node 42 at a logic one level and node 43 at a logic zero level. In a first case, the voltage pulse applied to input 22 returns to a logic zero level before the output of inverter 25 transitions from the logic one level to a logic zero level (due to the transition at output 23). In other words, the voltage pulse applied to input 22 has a pulse width less than the second predetermined time delay of delay circuit 29. The initial conditions for spike filter circuit 21 are shown in Table 4 for the first case.

TABLE 4

| input 22 | node 41 | node 42 | node 43 | output 23 |
|---|---|---|---|---|
| 0 | 0–1 | 1 | 0 | 1 |

The output of NOR gate 30 transitions from the logic zero level to a logic one level after the output of inverter 25 transitions to the logic zero level. The gate of n-channel enhancement MOSFET 34 is at the logic one level. Delay line 26 delays and inverts the output of NOR gate 30 for the first predetermined time delay. Delay line 26 operates similar to delay line 27 (described in the second mode of operation) and prevents latch 28 from being reset by a logic zero level applied to input 22 having a pulse width less than the minimum pulse width of a data bit. N-channel enhancement MOSFET 34 is enabled if the logic zero level applied to input 22 has a pulse width greater than the first predetermined time delay. The gate and the source of n-channel enhancement MOSFET 34 receives a logic one level and a logic zero level respectively that enables n-channel enhancement MOSFET 34 to transition node 42 from the logic one level to a logic zero level. When node 42 exceeds the predetermined threshold voltage (for a negative transition) of latch 28 it will latch and hold nodes 42 and 43 at logic zero and logic one levels respectively. The ouput of Schmitt trigger 33 transitions from the logic one level to a logic zero level. Spike filter circuit 21 is now armed for receiving a logic one level. The logic levels for spike filter circuit 21 are shown in Table 5 after latch 28 is reset.

TABLE 5

| input 22 | node 41 | node 42 | node 43 | output 23 |
|---|---|---|---|---|
| 0 | 1 | 0 | 1 | 1–0 |

In a second case, the output of inverter 25 transitions from the logic one level to a logic zero level (due to the transition at output 23) before the one logic level at input 22 transitions to a zero logic level. In other words, the voltage pulse applied to input 22 has a pulse width greater than the second predetermined time delay of delay circuit 29. The initial conditions for spike filter circuit 21 are shown in Table 6 for the second case.

TABLE 6

| input 22 | node 41 | node 42 | node 43 | output 23 |
|---|---|---|---|---|
| 1–0 | 0 | 0 | 0 | 1 |

The second predetermined time delay provided by delay circuit 29 does not affect the pulse width of the logic one level at output 23. The output of NOR gate 30 transitions from the logic zero level to a logic one level when input 22 transitions to a logic zero level. As mentioned above, the logic zero level applied to input 22 must have a pulse width greater than or equal to the minimum pulse width of a data bit for latch 28 to be reset. The gate and source of n-channel enhancement MOSFET 28 are at logic one and logic zero levels respectively after the first predetermined time delay of delay line 26. N-channel enhancement MOSFET 28 causes node 42 to transition from the logic one level to a logic zero level. Similar to the first case, when node 42 exceeds the predetermined threshold voltage (for a negative transition) of latch 28 it will latch and hold nodes 42 and 43 at logic zero and logic one levels respectively. Delay line 29 will inhibit spike filter circuit 21 from sensing a logic zero level when the output of inverter 25 transitions from the logic zero level to a logic one level. Spike filter circuit 21 is now armed for receiving a logic one level. The logic levels for spike filter circuit 21 are shown in Table 7 after latch 28 is reset.

TABLE 7

| input 22 | node 41 | node 42 | node 43 | output 2 |
|---|---|---|---|---|
| 0 | 1 | 0 | 1 | 1–0 |

Figure 4:
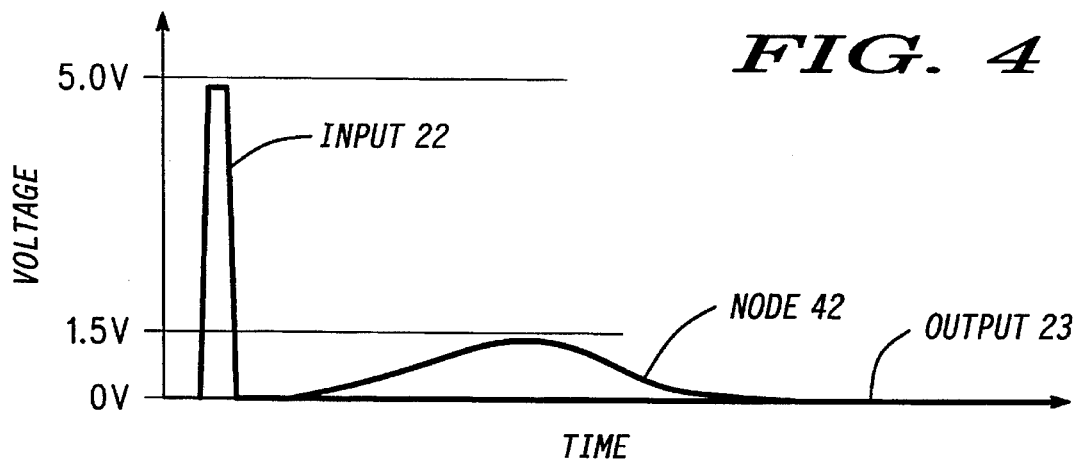
FIG. 4 is a timing diagram corresponding to the spike filter of FIG. 3 illustrating an input voltage pulse having a pulse width less than the minimum time pulse width of a data bit.

FIG. 4 is a timing diagram showing spike filter circuit 21 of FIG. 3 receiving a voltage pulse at input 22 having a pulse width less than the minimum pulse width of a data bit. Latch 28 of FIG. 3 has a threshold voltage for a positive voltage transition of 1.5 volts in this example. The output of pulse width sense circuit 24 of FIG. 3 (node 42) has a positive transition but does not rise above the threshold voltage of latch 28 to set a logic one level in latch 28, thus node 42 returns to a logic zero level. Spike filter circuit 21 has filtered out the voltage pulse thus output 23 of FIG. 3 remains at a logic zero level. The situation for a logic zero level having a pulse width less than the minimum pulse width of a data bit is analogous to the voltage pulse described above.

Figure 5:
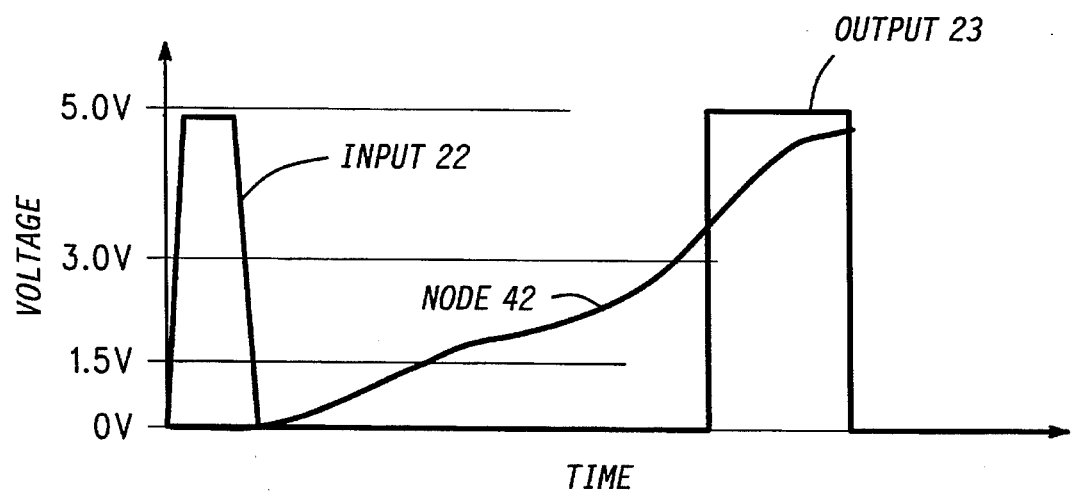
FIG. 5 is a timing diagram corresponding to the spike filter of FIG. 3 illustrating an input voltage pulse having a pulse width equal to the minimum time pulse width of a data bit.

FIG. 5 is a timing diagram showing spike filter circuit 21 of FIG. 3 receiving a voltage pulse at input 22 of FIG. 3 having a pulse width equal to the minimum pulse width of a data bit. Latch 28 of FIG. 3 has a threshold voltage for a positive voltage transition of 1.5 volts. Schmitt trigger 33 of FIG. 3 has a positive threshold voltage of 3.0 volts. Note that in this example the positive threshold voltage of Schmitt trigger 33 is significantly greater than the threshold voltage of latch 28 to minimize the possibility of the voltage at node 42 from falsely triggering Schmitt trigger 33.

The voltage pulse applied to input 22 causes pulse width sense circuit 24 of FIG. 3 to provide an output signal that exceeds the 1.5 volt threshold voltage of latch 28. Latch 28 is set and the positive feedback of the circuit begins to latch a logic one level at node 42 and a logic zero level at node 43 (FIG. 3). Schmitt trigger 33 is triggered when the voltage at node 42 exceeds its 3 volt positive threshold voltage thus driving output 23 (FIG. 3) to a logic one level.

In this example, delay circuit 29 of FIG. 3 has a delay greater than the minimum pulse width of a data bit. Although the voltage pulse returns to a logic zero level, pulse width sensing circuit 24 is inhibited from sensing the logic zero level at input 22 for the delay of delay circuit 29. After the delay of delay circuit 29, pulse width sense circuit 24 (FIG. 3) is armed for receiving the logic zero level at input 22. Transistor 34 of FIG. 3 is enabled and resets latch 28 causing nodes 42 and 43 to transition to logic zero and logic one levels respectively. The output of Schmitt trigger 33 transitions from the one logic level to a zero logic level when its input threshold voltage is exceeded. The pulse width of the voltage pulse at output 23 is greater than the voltage pulse applied to input 22. A logic zero level applied to input 22 having a pulse width greater than the minimum pulse width of a data bit is analogous to the voltage pulse described above.

By now it should be appreciated that a spike filter circuit has been provided that filters out signals having a pulse width less than the minimum pulse width of a data bit. The spike filter circuit also modifies the pulse width of the output waveform for providing a signal that is shaped to meet a systems particular specification.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A spike filter circuit comprising:

a pulse width sense circuit having an input and an output, said pulse width sense circuit for filtering signals having a pulse width less than a minimum pulse width of a data bit, said pulse width sense circuit including:

a first transistor having a first electrode, a control electrode coupled to said input of said pulse width sense circuit, and a second electrode;

a first delay line having an input coupled to said input of said pulse width sense circuit and an output coupled to said second electrode of said first transistor, said first delay line having a first predetermined time delay; and a latch having a first terminal coupled to said output of said pulse width sense circuit and a second terminal coupled to said first electrode of said first transistor.

2. A spike filter circuit as recited in claim 1 wherein said latch of said pulse width sense circuit comprises:

a first inverter having an input and an output coupled respectively to said first terminal and said second terminal of said latch; and a second inverter having an input and an output coupled respectively to said second terminal and said first terminal of said latch, said latch having a predetermined threshold voltage.

3. A spike filter circuit as recited in claim 1 wherein said first delay line comprises a first plurality of inverters coupled in series to provide said first predetermined time delay.

4. A spike filter circuit as recited in claim 1 wherein said pulse width sense circuit further includes:

an inverter having an input and an output;

a NOR gate having a first input coupled to said input of said pulse width sense circuit, a second input coupled to said output of said inverter, and an output;

a second transistor having a first electrode coupled to said output of said pulse width sense circuit, a control electrode coupled to said output of said NOR gate, and a second electrode; and a second delay line having an input coupled to said output of said NOR gate and an output coupled to said second electrode of said second transistor.

5. A spike filter circuit as recited in claim 4 wherein said second delay line comprises a second plurality of inverters coupled in series to provide a delay approximately equal to said first predetermined time delay.

6. A spike filter circuit as recited in claim 4 further including a Schmitt trigger having an input coupled to said output of said pulse width sense circuit and an output.

7. A spike filter circuit as recited in claim 6 wherein said Schmitt trigger has a predetermined thereshold voltage and wherein a magnitude of said predetermined threshold voltage of said Schmitt trigger is greater than a magnitude of said predetermined threshold voltage of said latch.

8. A spike filter circuit as recited in claim 6 further including a delay circuit having an input coupled to said output of said Schmitt trigger and an output coupled to said input of said inverter, said delay circuit having a second predetermined time delay.

9. A spike filter circuit as recited in claim 8 wherein said delay circuit comprises a plurality of inverters coupled in series to provide said second predetermined time delay.

10. A spike filter circuit including an input for receiving a digital signal and an output wherein each data bit of the digital signal has a pulse width greater than or equal to a minimum pulse width, the spike filter comprising:

a pulse width sense circuit having an input, a feedback input and an output, for filtering out signals having a pulse width less than the minimum pulse width of a data bit, said input of said pulse width sense circuit being coupled to the input of the spike filter circuit;

a Schmitt trigger having an input coupled to said output of said pulse width sense circuit and an output coupled to the output of the spike filter circuit; and a delay circuit having an input coupled to the output of the spike filter circuit and an output coupled to said feedback input of said pulse width sense circuit.

11. A spike filter circuit as recited in claim 10 wherein said pulse width sense circuit provides a voltage corresponding to a pulse width of a signal applied to the input of the spike filter circuit and wherein said voltage is less than a threshold voltage of said Schmitt trigger when said pulse width of said signal is less than the minimum pulse width of a data bit.

12. A spike filter circuit as recited in claim 11 wherein an output signal of the spike filter circuit transitions from a first logic level to a second logic level and said delay circuit inhibits said pulse width sense circuit from being responsive to an input signal applied to the input of the spike filter circuit having said first logic level for approximately a predetermined time delay of said delay circuit.

13. A spike filter circuit as recited in claim 10 wherein said delay circuit comprises a plurality of inverters coupled in series.

14. A spike filter circuit as recited in claim 10 wherein said pulse width sense circuit comprises:

a first transistor having a first electrode, a control electrode coupled to said input of said pulse width sense circuit, and a second electrode;

a first delay line having an input coupled to said input of said pulse width sense circuit and an output coupled to said second electrode of said first transistor, said first delay line having a first predetermined time delay; and a latch having a first terminal coupled to said output of said pulse width sense circuit and a second terminal coupled to said first electrode of said first transistor.

15. A spike filter as recited in claim 14 wherein said latch of said pulse width sense circuit comprises:

a first inverter having an input and an output coupled respectively to said first terminal and said second terminal of said latch; and a second inverter having an input and an output coupled respectively to said second terminal and said first terminal of said latch, said latch having a predetermined threshold voltage.

16. A spike filter as recited in claim 15 wherein said first delay line comprises a first plurality of inverters coupled in series for providing said first predetermined time delay.

17. A spike filter circuit as recited in claim 14 wherein said pulse width sense circuit further includes:

an inverter having an input coupled to said feedback input of said pulse width sense circuit and an output;

a NOR gate having a first input coupled to said input of said pulse width sense circuit, a second input coupled to said output of said inverter, and an output;

a second transistor having a first electrode coupled to said output of said pulse width sense circuit, a control electrode coupled to said output of said NOR gate, and a second electrode; and a second delay line having an input coupled to said output of said NOR gate and an output coupled to said second electrode of said second transistor.

18. A spike filter circuit as recited in claim 17 wherein said second delay line comprises a second plurality of inverters coupled in series for providing a delay substantially equal to said first predetermined time delay.

19. A method for filtering a digital signal wherein each data bit of the digital signal has a pulse width greater than or equal to a minimum pulse width, the method comprising:

receiving an input signal of a first logic level at an input of said filter wherein an output of said filter is at a second logic level;

generating a detect signal having a voltage magnitude corresponding to a pulse width of said input signal, said voltage magnitude of said detect signal exceeding a predetermined threshold voltage when said pulse width is greater than the minimum pulse width;

changing said output at said output of said filter from said second logic level to said first logic level when said detect signal exceeds said predetermined threshold voltage; and disabling said input of said filter for a predetermined time when said output changes to said first logic level.

\* \* \* \* \*